(12) United States Patent
Yi et al.

(10) Patent No.: US 6,894,305 B2
(45) Date of Patent: May 17, 2005

(54) PHASE-CHANGE MEMORY DEVICES WITH A SELF-HEATER STRUCTURE

(75) Inventors: Ji-hye Yi, Kyunggi-do (KR); Horii Hideki, Seoul (KR); Yong-ho Ha, Kyunggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/780,073

(22) Filed: Feb. 17, 2004

(65) Prior Publication Data

US 2004/0164290 A1 Aug. 26, 2004

(30) Foreign Application Priority Data

Feb. 24, 2003 (KR) .............................. 10-2003-0011356

(51) Int. Cl.[7] .............................................. H01L 47/00
(52) U.S. Cl. .............................. 257/4; 257/2; 257/200; 257/530; 257/734; 438/131; 365/145; 365/175
(58) Field of Search ................................ 257/2, 4, 184, 257/194, 200, 203, 400, 421, 530, 734; 438/131; 365/145, 175

(56) References Cited

U.S. PATENT DOCUMENTS

2002/0036931 A1    3/2002  Lowrey et al. ............. 365/200

2003/0209746 A1 *  11/2003  Horii ........................... 257/295
2004/0000678 A1 *  1/2004   Fricke et al. ................ 257/209

OTHER PUBLICATIONS

Lai et al. "OUM—A 180 nm Nonvolatile Memory Cell Element Technology For Stand Alone and Embedded Applications," *IEDM Tech. Dig.* 2001.

* cited by examiner

Primary Examiner—Nathan J. Flynn
Assistant Examiner—Scott R. Wilson
(74) Attorney, Agent, or Firm—Myers Bigel Sibley & Sajovec

(57) ABSTRACT

Phase change memory devices include a phase-change memory layer on a semiconductor substrate. The phase-change memory layer has a major axis that is substantially parallel to a major axis of the semiconductor substrate and has a first surface and a second surface opposite the first surface that are substantially parallel to the major axis of the phase-change memory layer. A first electrode is provided on the semiconductor substrate that is electrically connected to the first surface of the phase-change memory layer in a first contact region of the phase-change memory layer. A second electrode is provided on the semiconductor substrate that is electrically connected to the phase-change memory layer in a second contact region of the phase-change memory layer. The second contact region is space apart from the first contact region.

31 Claims, 3 Drawing Sheets

PHASE-CHANGE MEMORY DEVICES WITH A SELF-HEATER STRUCTURE

CLAIM OF PRIORITY

This application claims priority from Korean Patent Application No. 2003-11356, filed on Feb. 24, 2003, in the Korean Intellectual Property Office, the contents of which are incorporated herein by reference in its entirety.

FIELD OF THE INVENTION

The present invention relates to phase-change memory devices, and more particularly, to phase-change random access memory (PRAM) using characteristics of chalcogenide.

BACKGROUND OF THE INVENTION

Conventional PRAMs are memory devices using characteristics of a phase-change material, such as chalcogenide, the electric resistance of which varies according to its crystalline phase. A phase-change material layer formed of chalcogenide is partially changed to be in a crystalline or amorphous phase according to the applied current profile. The crystalline phase of a phase-change material layer can be selectively changed by, for example, temperature variation. That is, a temperature variation occurs by adjusting the current profile, which is applied to the phase-change material layer, thus causing a change in the crystalline phase of the phase-change material layer. For example, a phase-change material layer is heated to its melting point, i.e., about 610° C., by applying a relatively high current pulse for a short duration of time. The phase-change material layer is then rapidly cooled. Thus, the phase-change material layer is changed to be in a highly resistive amorphous phase, i.e., a RESET phase. Inversely, if the phase-change material layer is cooled by applying a relatively low current pulse, it is changed to be in a low resistive crystalline phase, i.e., a SET phase.

Reducing the amount of current required by a phase-change material layer to change its crystalline phase may decrease power dissipation and improve reliability during operation of phase-change memory devices. As a result, attempts have been made to scale down the contact area between the phase-change material layer and a contact plug in order to enhance heating efficiency.

Typically, a conventional phase-change memory device has a vertical contact structure, in which a lower electrode, a phase-change material layer, and an upper electrode are vertically and sequentially connected (see e.g., "OUM-A 180 nm Nonvolatile Memory Cell Element Technology For Stand Alone and Embedded Applications," by Stefan Lai & Tyler Lowrey, IEDM Tech. Dig. 2001). In this structure, the contact area between the phase-change material layer and the lower electrode is reduced as much as possible so that the current density of the two contact surfaces is rapidly increased, thus causing Joule heating. Here, to reduce the current amount, which will be supplied to a transistor, and enhance Joule heating efficiency, the current density should be increased during programming by reducing the contact area between the phase-change material layer and the lower electrode to be as small as possible. Also, if a lower electrode with a relatively small area is formed, area variations among memories, chips, and wafers should be as small as possible. However, area variations within a permitted range, typically, cannot be easily obtained because of current photolithographic and etching restrictions. Further, a conventional phase-change memory device with a vertical contact structure includes an upper electrode, which is formed on a phase-change material layer using an etching process. Accordingly, the two contact surfaces, i.e., one contact surface between the phase-change material layer and a lower electrode and the other contact surface between the phase-change material layer and the upper electrode, typically cannot be used as phase-change portions. Also, drive conditions of the memory device can depend greatly on contact resistances of the phase-change material layer and a lower electrode. However, since the contact area between the phase-change material layer and the lower electrode is small, the contact resistances may vary within a large range, thus degrading reliability.

SUMMARY OF THE INVENTION

Embodiments of the present invention provide phase change memory devices that include a phase-change memory layer on a semiconductor substrate. The phase-change memory layer has a major axis that is substantially parallel to a major axis of the semiconductor substrate and has a first surface and a second surface opposite the first surface that are substantially parallel to the major axis of the phase-change memory layer. A first electrode is provided on the semiconductor substrate that is electrically connected to the first surface of the phase-change memory layer in a first contact region of the phase-change memory layer. A second electrode is provided on the semiconductor substrate that is electrically connected to the phase-change memory layer in a second contact region of the phase-change memory layer. The second contact region is space apart from the first contact region.

In further embodiments of the present invention, the second surface of the phase-change memory layer is opposite the substrate from the first surface of the phase-change memory layer. In other embodiments of the present invention, the first surface of the phase-change memory layer is opposite the substrate from the second surface of the phase-change memory layer.

In additional embodiments of the present invention, the first electrode is at a first level with respect to the substrate and the second electrode is at a second level with respect to the substrate. The first level and the second level are different distances from the substrate. The phase-change memory layer may be at a third level with respect to the substrate where the third level is a distance from the substrate that is greater than a distance from the substrate of the first level and less than a distance from the substrate of the second level. A third electrode may also be provided at a fourth level with respect to the substrate. The fourth level may be a distance from the substrate that is less than the distance from the substrate of the third level. The third electrode may electrically connect the second electrode to the phase-change memory layer.

In still further embodiments of the present invention, the first electrode and the second electrode may be at the same level with respect to the substrate.

In yet additional embodiments of the present invention, the phase-change memory layer includes a phase-change material layer and a metal layer on the phase change material layer. The metal layer is on a surface of the phase-change material layer opposite the first and second contact regions.

In additional embodiments of the present invention, phase-change memory devices include a first conductive layer on a semiconductor substrate on a first level and a second conductive layer on the semiconductor substrate on a second level. The second level is a different distance from the semiconductor substrate than the first level. A phase-change memory layer extends substantially parallel to a main surface of the semiconductor substrate and has a first surface facing the semiconductor substrate. A first contact surface on the first surface of the phase-change memory layer allows an electrical connection from the first conductive layer to the phase-change memory layer and a second contact surface on the first surface of the phase-change memory layer spaced apart from the first contact surface allows an electrical connection from the phase-change memory layer to the second conductive layer.

In further embodiments of the present invention, the first contact surface provides for a flow of current from the first conductive layer to the phase-change memory layer and the second contact surface provides for a flow of current from the phase-change memory layer to the second conductive layer.

In still further embodiments of the present invention, a third conductive layer is provided on the first level and spaced apart from the first conductive layer. The second contact surface is electrically connected to the second conductive layer through the third conductive layer. A first contact plug may electrically connect the first contact surface and the first conductive layer and a second contact plug may electrically connect the second contact surface and the third conductive layer. The first contact plug and the second contact plug may be formed on the semiconductor substrate on the same level.

In additional embodiments of the present invention, the surface of the phase-change memory layer, except portions where the first contact surface and the second contact surface are provided, is covered with an insulating layer. The second conductive layer may also be formed on the semiconductor substrate on a level that is farther from the substrate than the level on which the first conductive layer is formed.

In certain embodiments of the present invention, the phase-change memory layer is provided on the semiconductor substrate on a level that is spaced a greater distance from the substrate than the level on which the first conductive layer is formed. The second conductive layer may also be provided on the semiconductor substrate on a level that is spaced a greater distance from the substrate than the level on which the phase-change memory is formed.

In further embodiments of the present invention, the phase-change memory layer includes a phase-change material layer containing chalcogen elements. The phase-change memory layer may include a phase-change material containing chalcogen elements and a metal layer covering a surface of the phase-change material layer opposite the substrate. The phase-change memory layer may be a material selected from the group consisting of Te, Se, Ge, any mixture thereof, and any alloy thereof. The phase-change memory layer may be a material selected from the group consisting of Te, Se, Ge, Sb, Bi, Pb, Sn, As, S, Si, P, O, any mixture thereof, and any alloy thereof.

In yet additional embodiments of the present invention, phase-change memory devices include a phase-change memory layer having a first surface facing a semiconductor substrate and a second surface which is opposite the first surface. A plurality of conductive layers are provided between the semiconductor substrate and the phase-change memory layer. A plurality of contact plugs are connected to the first surface of the phase-change memory layer such that the phase-change memory layer is electrically connected to ones of the plurality of conductive layers. An insulating layer covers the second surface of the phase-change memory layer.

The plurality of contact plugs may include a first contact plug configured to apply an electric signal from a first conductive layer selected from the plurality of conductive layers to the phase-change memory layer and a second contact plug configured to apply an electric signal from the phase-change memory layer to a second conductive layer selected from the plurality of conductive layers. The phase-change memory layer may include a phase-change material layer containing chalcogen elements. The phase-change memory layer may also include a phase-change material containing chalcogen elements and a metal layer covering a surface of the phase-change material layer opposite the substrate.

In still further embodiments of the present invention, phase-change memory devices include a lower electrode on a semiconductor substrate, an upper electrode on the lower electrode and a phase-change memory layer between the lower electrode and the upper electrode. The phase-change memory layer has a first surface adjacent the lower electrode. A first contact plug is connected to the first surface of the phase-change memory layer and is configured to electrically connect the lower electrode to the phase-change memory layer. A second contact plug is connected to the upper electrode and the first contact plug.

The first contact plug and the second contact plug may be connected to each other on a same level below the phase-change memory layer. The first contact plug and the second contact plug may be connected to each other by the lower electrode. The phase-change memory layer may include a phase-change material layer containing chalcogen elements. The phase-change memory layer may include a phase-change material containing chalcogen elements and a metal layer covering the top surface of the phase-change material layer.

In further embodiments of the present invention, a second lower electrode is provided on the substrate and a third contact plug connects the second lower electrode to the phase-change material layer.

DETAILED DESCRIPTION OF THE INVENTION

Figure 1:
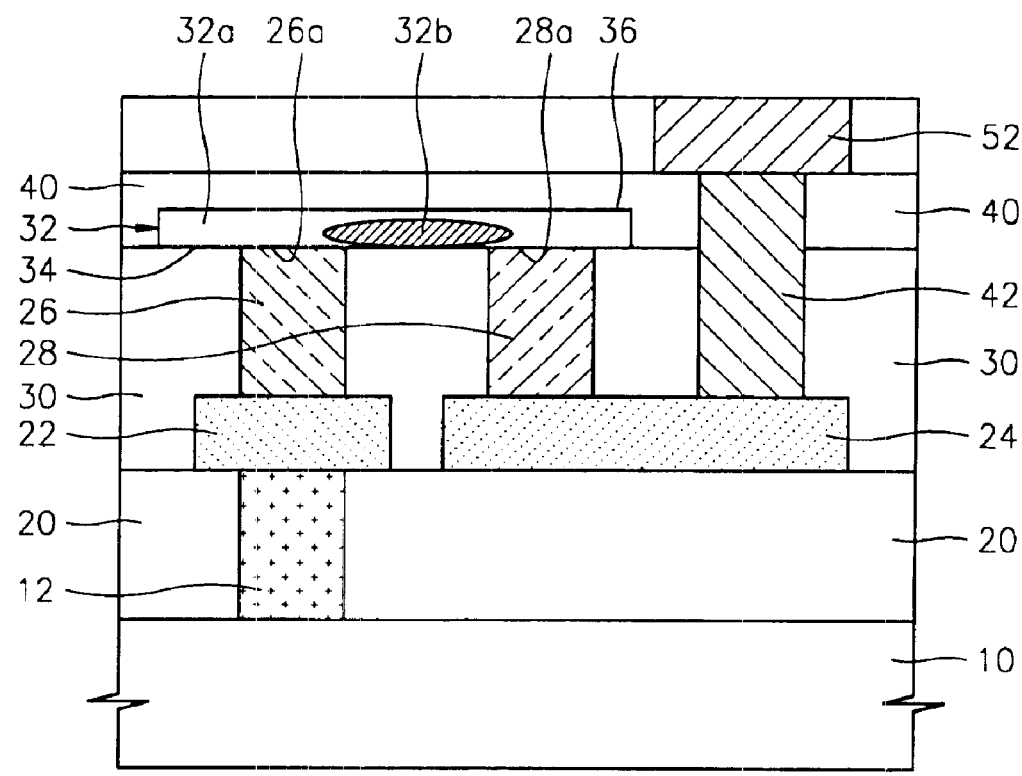
FIG. 1 is a cross-sectional view of a phase-change memory device according to embodiments of the present invention.

The present invention will now be described more fully with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

Particular embodiments of the present invention provide phase-change memory devices that can be driven using a low current, that allow a reduction in unit cell area irrespective of photolithographic and etching restrictions and/or can improve reliability by uniformly controlling operations thereof.

According to certain embodiments of the present invention, a phase-change memory layer extends along a current flow path between a lower electrode and an upper electrode so that the phase-change memory layer itself can function as an effective Joule heater. Therefore, because the phase-change memory device of certain embodiments of the present invention can reduce the current amount to half or less compared with a conventional phase-change memory device, the width of a transistor can markedly decrease, enabling the manufacture of a highly integrated phase-change memory devices. Also, it may be possible to adjust the range of a phase-change portion including the vicinity of a portion, at which a current flow can be adjusted, by controlling the thickness and width of the phase-change material layer. Accordingly, irrespective of photolithographic and etching restrictions, the volume of the phase-change portion in the phase-change material layer can be adjusted to control current flow. As a result, the uniformity and reliability of the phase-change memory device may be improved.

Embodiments of the present invention are described herein with reference to current flowing from a lower electrode to an upper electrode. However, as will be appreciated by those of skill in the art in light of the present disclosure, current could also flow from the upper electrode to the lower electrode depending on the configuration of the circuit driving the phase-change memory layer. Accordingly, embodiments of the present invention should not be construed as limited to a particular current direction.

FIG. 1 is a schematic cross-sectional view of phase-change memory devices according to certain embodiments of the present invention.

Referring to FIG. 1, phase-change memory devices according to certain embodiments of the present invention include a lower electrode, i.e., a first conductive layer 22, a phase-change memory layer 32, and an upper electrode, i.e., a second conductive layer 52, which are sequentially formed on a semiconductor substrate 10 where a transistor (not shown) is formed.

The first conductive layer 22 is disposed on the semiconductor substrate 10 on a first level and electrically connected to a source/drain region (not shown) formed in the semiconductor substrate 10 through a contact 12, which is formed to penetrate a first interlayer dielectric (ILD) 20. The first conductive layer 22 can be formed of a metal, an alloy, a metal oxynitride, and/or a conductive carbon compound. For example, the first conductive layer 22 may be formed of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON.

A third conductive layer 24 is formed on the first ILD 20 on the same level as the first conductive layer 22 to be spaced apart from the first conductive layer 22. The first conductive layer 22 is electrically isolated from the third conductive layer 24 by a second ILD 30. The third conductive layer 24 can be formed of a metal, an alloy, a metal oxynitride, and/or a conductive carbon compound. For example, the third conductive layer 24 may be formed of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON.

The phase-change memory layer 32 is positioned on the second ILD 30 formed on the first ILD 20 on a level that is higher than the level on which the first conductive layer 22 is formed, and extends to be substantially parallel to the main surface of the semiconductor substrate 10. The phase-change memory layer 32 has a bottom surface facing the semiconductor substrate 10, e.g., a first surface 34, and a top surface that is opposite the first surface 34, e.g., a second surface 36. Thus, the phase change memory layer 32 has a major axis that is substantially parallel to a major axis of the substrate 10 and has first and second surfaces 34 and 36 that are substantially parallel to the major axis of the phase-change memory layer 32.

Figure 2:
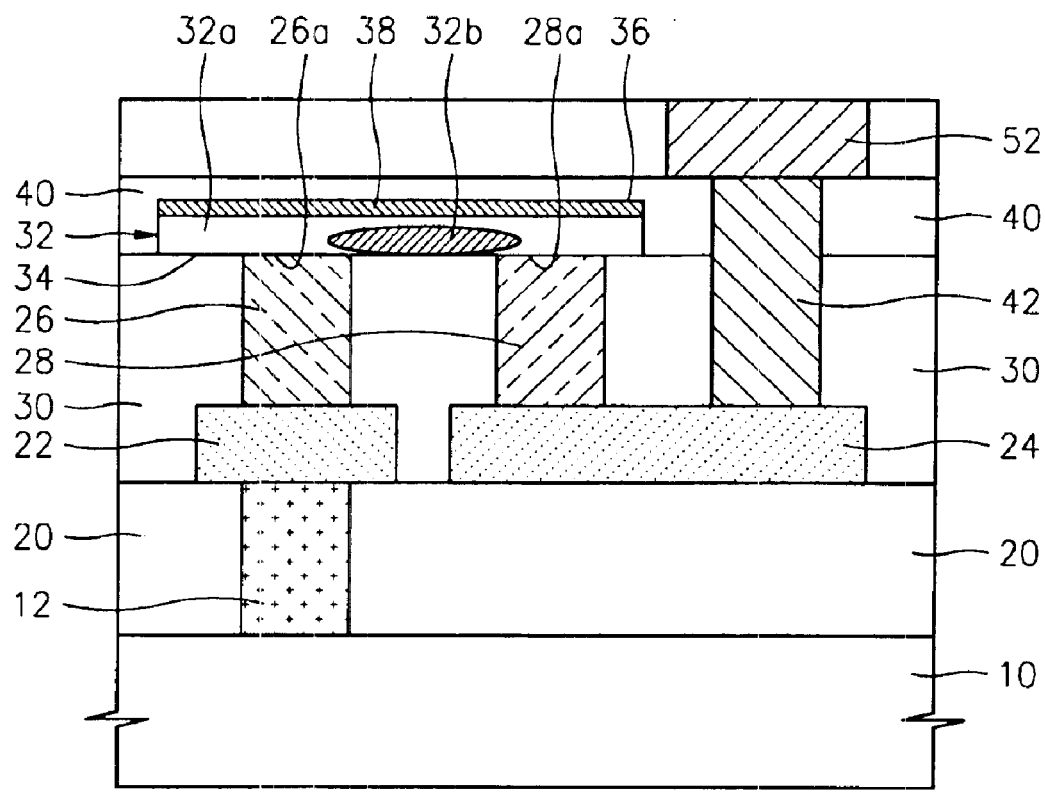
FIG. 2 is a cross-sectional view of a phase-change memory device according to further embodiments of the present invention.

The phase-change memory layer 32 is formed of a phase-change material layer 32a containing, for example, chalcogen elements. In FIG. 1, an example phase-change memory layer 32 is formed of only the phase-change material layer 32a. However, as shown in FIG. 2, a phase-change memory layer 32 may be formed of a phase-change material layer 32a containing chalcogen elements and a metal layer 38 covering the top surface of the phase-change material layer 32a. The sidewalls and top surface of the phase-change memory layer 32 are covered with a third ILD 40.

The phase-change material layer 32a is formed of Te, Se, Ge, any mixture thereof, and/or any alloy thereof. For example, the phase-change material layer 32a may be formed of Te, Se, Ge, Sb, Bi, Pb, Sn, As, S, Si, P, O, any mixture thereof, and/or any alloy thereof. In particular embodiments of the present invention, the phase-change material layer 32a is formed of a combination of Ge, Sb, and Te or a combination of In, Sb, Te, and Ag.

A first contact surface 26a is provided on the first surface 34 of the phase-change memory layer 32 to be electrically connected to a first contact plug 26. The phase-change memory layer 32 receives an electric signal from the first conductive layer 22 through the first contact plug 26 connected to the first contact surface 26a. The first contact plug 26 may be formed of, for example, tungsten.

Also, a second contact surface 28a is provided on the first surface 34 of the phase-change memory layer 32 and is spaced apart from the first contact surface 26a. The second contact surface 28a is electrically connected to a second contact plug 28. The phase-change memory layer 32 supplies an electric signal to the second conductive layer 52 through the second contact plug 28 connected to the second contact surface 28a. The second contact plug 28 may be formed of, for example, tungsten.

The second conductive layer 52 is formed on the third ILD 40, which covers the phase-change memory layer 32 on the semiconductor substrate 10. The second conductive layer 52 can be formed of a metal, an alloy, a metal oxynitride, and/or a conductive carbon compound. For example, the second conductive layer 52 may be formed of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON.

The second conductive layer 52 can be electrically connected to the third conductive layer 24 through a third contact plug 42, which is formed to penetrate the second ILD 30 and the third ILD 40. The third contact plug 42 may be formed of, for example, tungsten. Here, the phase-change memory layer 32 supplies an electric signal through the second contact plug 28, the third conductive layer 24, and the third contact plug 42 to the second conductive layer 52.

In certain embodiments of the phase-change memory device of the present invention, the surface of the phase-change memory layer 32, except portions where the first contact surface 26a and the second contact surface 28a are provided, is covered with the second ILD 30 and/or the third ILD 40. The first contact surface 26a and the second contact surface 28a are spaced apart on the first surface 34 of the phase-change memory layer 32. Each of the two contact surfaces, i.e., each of the first contact surface 26a and the second contact surface 28a that are formed on the same level, functions as a Joule heater that causes a change in the phase of the phase-change memory layer 32 during current supply to the phase-change memory layer 32. Here, the first contact surface 26a functions as a heater in response to an electric signal from the first conductive layer 22, while the second contact surface 28a functions as a self-heater due to the change in the phase of the phase-change memory layer 32 itself.

Figure 3:
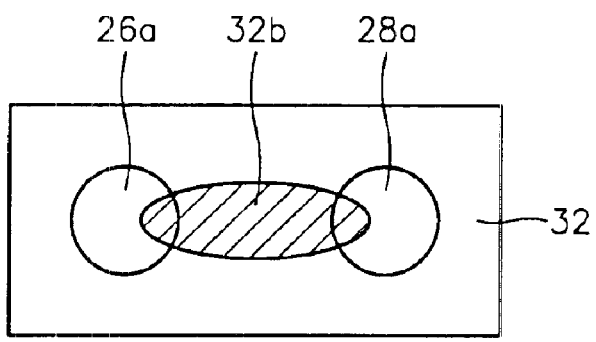
FIG. 3 is a layout of a phase-change memory layer according to embodiments of the present invention, illustrating a phase-change portion being formed during a current supply to the phase-change memory layer.

FIG. 3 is a layout of the phase-change memory layer 32 as shown in FIGS. 1 and 2 and shows a phase-change portion 32b being formed in the phase-change memory layer 32 when current is supplied to the phase-change memory layer 32.

As shown in FIG. 3, the phase-change memory layer 32 extends along a current flow path between the first electrode 22 and the second electrode 52. Also, the first contact surface 26a and the second contact surface 28a, each of which functions as a Joule heater at the bottom of the phase-change memory layer 32, are formed on the same level. This allows the phase-change memory layer 32 itself to function as an effective Joule heater. Thus, in certain embodiments of the present invention, during programming using the same current amount, the volume of the phase-change portion 32b can be about 2 times or more larger than that of a corresponding phase-change portion in a conventional phase-change memory device with a single Joule heater. Accordingly, the current amount, required by a transistor for programming, may, in certain embodiments of the present invention, decrease by one-half of that required by the conventional device. Thus, certain embodiments of the present invention may reduce the width of the transistor to half or less of the conventional device. As a result, highly integrated memory devices can be manufactured. Further, because certain embodiments of the phase-change memory device of the present invention can be operated using one half or less the current amount required by the conventional device, reliability may be improved.

Additionally, in certain embodiments of the present invention, a drive condition of the phase-change memory device, i.e., a programmable volume, is primarily determined by the dimensions of the phase-change memory layer 32. On the other hand, in the conventional device, the volume of a phase-change portion in a phase-change memory layer depends greatly on the contact area between a lower electrode and the phase-change memory layer. Thus, to control the volume of the phase-change portion, the contact area between the lower electrode and the phase-change memory layer is typically adjusted using photolithographic and etching processes. However, in certain embodiments of the present invention, the thickness and width of the phase-change material layer 32a constituting the phase-change memory layer 32 determine the volume of the phase-change portion 32b. That is, it is possible to adjust the range of the phase-change portion 32b including the vicinity of a portion, at which current flow can be adjusted, by controlling the thickness and width of the phase-change material layer 32. Accordingly, unlike the conventional device, the volume of the phase-change portion 32b in certain embodiments of the present invention can be adjusted to control a current flow irrespective of photolithographic and etching restrictions. As a result, certain embodiments of the present invention may improve resistive distribution between chips or wafers and may enhance uniformity during drive operations.

Operations of the phase-changeable memory device illustrated in FIGS. 1 through 3 are explained below with reference to FIG. 4 which is an equivalent circuit view of the devices illustrated in FIGS. 1 through 3.

Figure 4:
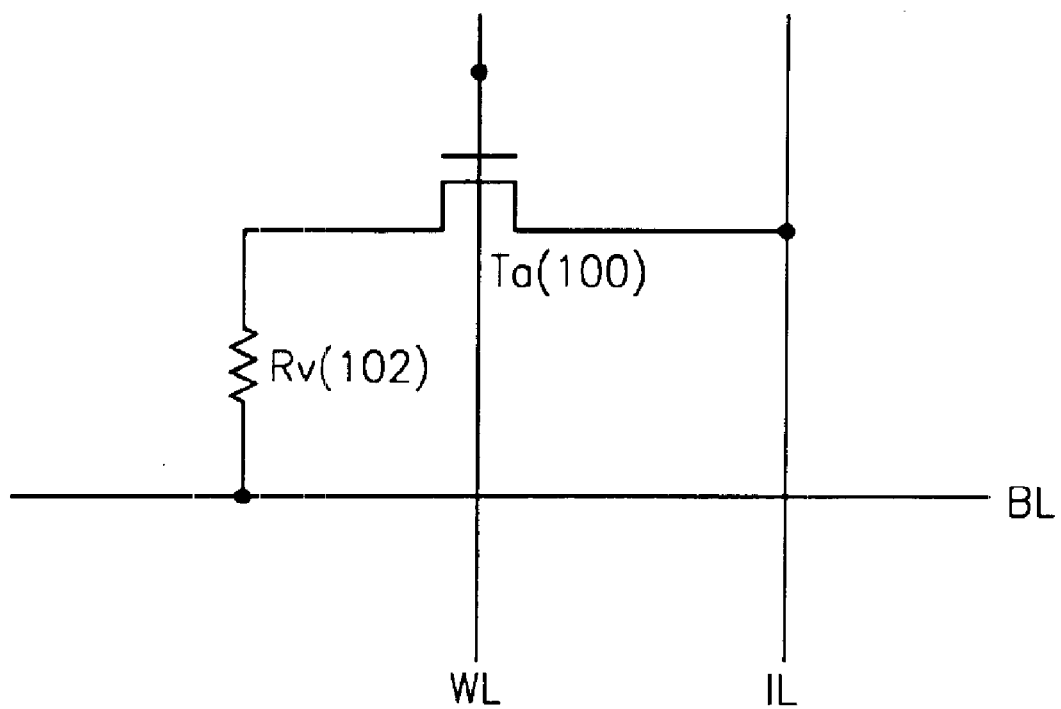
FIG. 4 is a schematic illustration of a phase-change memory device according to embodiments of the present invention.

As seen in FIG. 4, the phase-changeable memory device includes an access transistor Ta 100 and a variable resistor Rv 102. The variable resistor Rv 102 includes a phase-change material layer configuration as illustrated in any of FIGS. 1 through 3. An electrode of the variable resistor Rv 102 is connected to a bit line BL. The access transistor Ta 100 includes a drain region, a source region and a gate electrode. The drain region is electrically connected to the and interconnection layer IL, the source region is electrically connected to an electrode of the variable resistor Rv 102, and the gate electrode is a word line WL.

In a write operation for writing logic information (e.g., "0" (a high resistance state) or "1" (a low resistance state)) to the variable resistor Rv 102, a signal sufficient to turn on the access transistor Ta is applied to the word line WL and a bit line BL is grounded. Then, a signal is input to the interconnection IL. The signal input to the interconnection IL corresponds to a current pulse having a magnitude and duration corresponding to the logic information to be written. Therefore, current flows between the interconnection IL and the bit line BL through the variable resistor Rv. The phase-change material layer of the variable resistor Rv changes the crystalline state thereof based on the current pulse, thereby changing a resistance of the variable resistor Rv.

With regard to a read operation for reading logic information of the variable resistor Rv, a signal sufficient to turn on the access transistor Ta is applied to a word line WL, the interconnection IL is grounded, and an operation voltage is applied to a bit line BL. In this case, the operation voltage is not sufficient to change the crystalline state of the phase-changeable material pattern. Therefore, current flows between the bit line BL and the interconnection IL via the variable resistor Rv and a resistivity of the phase-changeable material pattern (i.e., logic information) is sensed through the bit line BL.

While embodiments of the present invention have been illustrated with respect to the connections to the phase-change memory layer 32 being provide on a surface to the phase-change memory layer that is adjacent the substrate 10, the connections to the phase-change memory layer could, alternatively, be provided on a surface of the phase-change memory layer 32 that is opposite the substrate.

While the present invention has been particularly shown and described with reference to particular embodiments thereof, it will be understood by those of ordinary skill in the art that various changes in form and details may be made therein without departing from the spirit and scope of the present invention as defined by the following claims.

What is claimed is:

1. A phase-change memory device comprising:
    a first conductive layer on a semiconductor substrate on a first level;
    a second conductive layer on the semiconductor substrate on a second level, the second level being a different distance from the semiconductor substrate than the first level;
    a phase-change memory layer that extends substantially parallel to a main surface of the semiconductor substrate and has a first surface facing the semiconductor substrate;
    a first contact surface on the first surface of the phase-change memory layer to allow an electrical connection from the first conductive layer to the phase-change memory layer; and
    a second contact surface on the first surface of the phase-change memory layer spaced apart from the first contact surface to allow an electrical connection from the phase-change memory layer to the second conductive layer.

2. The device of claim 1, wherein the first contact surface provides for a flow of current from the first conductive layer to the phase-change memory layer and the second contact surface provides for a flow of current from the phase-change memory layer to the second conductive layer.

3. The device of claim 1, further comprising a third conductive layer on the first level and spaced apart from the first conductive layer,
    wherein the second contact surface is electrically connected to the second conductive layer through the third conductive layer.

4. The device of claim 3, further comprising:
    a first contact plug, which electrically connects the first contact surface and the first conductive layer; and
    a second contact plug, which electrically connects the second contact surface and the third conductive layer.

5. The device of claim 4, wherein the first contact plug and the second contact plug are on the semiconductor substrate on the same level.

6. The device of claim 1, wherein the surface of the phase-change memory layer, except portions where the first contact surface and the second contact surface are provided, is covered with an insulating layer.

7. The device of claim 1, wherein the second level is a greater distance from the substrate than the first level.

8. The device of claim 1, wherein the phase-change memory layer is formed on the semiconductor substrate on a third level that is spaced a greater distance from the substrate than the first level.

9. The device of claim 8, wherein the second level is spaced a greater distance from the substrate than the third level.

10. The device of claim 1, wherein the phase-change memory layer includes a phase-change material layer containing chalcogen elements.

11. The device of claim 1, wherein the phase-change memory layer includes a phase-change material containing chalcogen elements and a metal layer covering a surface of the phase-change material layer opposite the substrate.

12. The device of claim 1, wherein the phase-change memory layer includes a material selected from the group consisting of Te, Se, Ge, any mixture thereof, and any alloy thereof.

13. The device of claim 12, wherein the phase-change memory layer includes a material selected from the group consisting of Te, Se, Ge, Sb, Bi, Pb, Sn, As, S, Si, P, O, any mixture thereof, and any alloy thereof.

14. A phase-change memory device comprising:
    a phase-change memory layer having a first surface facing a semiconductor substrate and a second surface which is opposite the first surface;
    a plurality of conductive layers between the semiconductor substrate and the phase-change memory layer;
    a plurality of contact plugs connected to at least two different contact regions of the first surface of the phase-change memory layer such that the phase-change memory layer is electrically connected to ones of the plurality of conductive layers; and
    an insulating layer, which covers the second surface of the phase-change memory layer.

15. The device of claim 14, wherein the phase-change memory layer includes a phase-change material layer containing chalcogen elements.

16. The device of claim wherein the phase-change memory layer includes a phase-change material containing chalcogen elements and a metal layer covering a surface of the phase-change material layer opposite the substrate.

17. A phase-change memory device comprising:
    a phase-change memory layer having a first surface facing a semiconductor substrate and a second surface which is opposite the first surface;
    a plurality of conductive layers between the semiconductor substrate and the phase-change memory layer;
    a plurality of contact plugs connected the first surface of the phase-change memory layer such that the phase-change memory layer is electrically connected to ones of the plurality of conductive layers;
    an insulating layer, which covers the second surface of the phase-change memory layer;
    wherein the plurality of contact plugs include:
    a first contact plug configured to apply an electric signal from a first conductive layer selected from the plurality of conductive layers to the phase-change memory layer; and
    a second contact plug configured to apply an electric signal from the phase-change memory layer to a second conductive layer selected from the plurality of conductive layers.

18. A phase-change memory device comprising:
    a lower electrode on a semiconductor substrate;
    an upper electrode on the lower electrode;
    a phase-change memory layer between the lower electrode and the upper electrode, the phase-change memory layer having a first surface adjacent the lower electrode;
    a first contact plug connected to the first surface of the phase-change memory layer and configured to supply an electric signal from the lower electrode to the phase-change memory layer; and a second contact plug connected to the upper electrode and the first contact plug.

19. The device of claim 18, wherein the first contact plug and the second contact plug are connected to each other on a same level below the phase-change memory layer.

20. The device of claim 19, wherein the first contact plug and the second contact plug are connected to each other by the lower electrode.

21. The device of claim 20, further comprising:

a second lower electrode on the substrate; and a third contact plug that connects the second lower electrode to the phase-change material layer.

22. The device of claim 18, wherein the phase-change memory layer is formed of a phase-change material layer containing chalcogen elements.

23. The device of claim 18, wherein the phase-change memory layer includes a phase-change material containing chalcogen elements and a metal layer covering the top surface of the phase-change material layer.

24. A phase change memory device comprising:

a phase-change memory layer on a semiconductor substrate, the phase-change memory layer having a major axis that is substantially parallel to a major axis of the semiconductor substrate and having a first surface and a second surface opposite the first surface that are substantially parallel to the major axis of the phase-change memory layer;

a first electrode on the semiconductor substrate that is electrically connected to the first surface of the phase-change memory layer in a first contact region of the phase-change memory layer; and a second electrode on the semiconductor substrate that is electrically connected to the first surface of the phase-change memory layer in a second contact region of the phase-change memory layer, the second contact region being space apart from the first contact region.

25. The device of claim 24, wherein the second surface of the phase-change memory layer is opposite the substrate from the first surface of the phase-change memory layer.

26. The device of claim 24, wherein the first surface of the phase-change memory layer is opposite the substrate from the second surface of the phase-change memory layer.

27. The device of claim 24, wherein the first electrode is at a first level with respect to the substrate and the second electrode is at a second level with respect to the substrate, wherein the first level and the second level are different distances from the substrate.

28. The device of claim 27, wherein the phase-change memory layer is at a third level with respect to the substrate, the third level being a distance from the substrate that is greater than a distance from the substrate of the first level and less than a distance from the substrate of the second level.

29. The device of claim 28, further comprising a third electrode at a fourth level with respect to the substrate, the fourth level being a distance from the substrate that is less than the distance from the substrate of the third level, wherein the third electrode electrically connects the second electrode to the phase-change memory layer.

30. The device of claim 24, wherein the first electrode and the second electrode are at a same level with respect to the substrate.

31. The device of claim 24, wherein the phase-change memory layer comprises:

a phase-change material layer; and a metal layer on the phase change material layer, the metal layer being on a surface of the phase-change material layer opposite the first and second contact regions.

* * * * *

UNITED STATES PATENT AND TRADEMARK OFFICE
CERTIFICATE OF CORRECTION

PATENT NO. : 6,894,305 B2
DATED : May 17, 2005
INVENTOR(S) : Yi et al.

It is certified that error appears in the above-identified patent and that said Letters Patent is hereby corrected as shown below:

Column 10,
Line 30, should read -- 16. The device of claim 14, wherein the phase-change --.

Signed and Sealed this

Twentieth Day of September, 2005

JON W. DUDAS
*Director of the United States Patent and Trademark Office*